US009360378B2

(12) United States Patent
Ballandras et al.

(10) Patent No.: US 9,360,378 B2
(45) Date of Patent: Jun. 7, 2016

(54) ELECTRICAL DEVICE AND METHOD FOR PRODUCING SAME

(71) Applicants: CENTRE NATIONAL DE LA RECHERCHE SCIENTIFIQUE (C.N.R.S.), Paris (FR); UNIVERSITE DE FRANCHE-COMTE, Besancon (FR)

(72) Inventors: Sylvain Ballandras, Besancon (FR); Bruno Francois, Besancon (FR)

(73) Assignee: CENTRE NATIONAL DE LA RECHERCHE SCIENTIFIQUE (C.N.R.S.), Paris (FR)

( * ) Notice: Subject to any disclaimer, the term of this patent is extended or adjusted under 35 U.S.C. 154(b) by 52 days.

(21) Appl. No.: 14/395,467

(22) PCT Filed: Apr. 3, 2013

(86) PCT No.: PCT/EP2013/057042
§ 371 (c)(1),
(2) Date: Oct. 17, 2014

(87) PCT Pub. No.: WO2013/156309
PCT Pub. Date: Oct. 24, 2013

(65) Prior Publication Data
US 2015/0131244 A1    May 14, 2015

(30) Foreign Application Priority Data

Apr. 18, 2012    (FR) ...................................... 12 53568

(51) Int. Cl.
*H05K 7/00*    (2006.01)
*G01K 11/26*    (2006.01)
(Continued)

(52) U.S. Cl.
CPC ............ *G01K 11/265* (2013.01); *B23K 1/0016* (2013.01); *H05K 1/0293* (2013.01); *H05K 1/181* (2013.01); *H05K 3/285* (2013.01); *B23K 2201/38* (2013.01); *H01L 2224/45147* (2013.01); *H01L 2224/48091* (2013.01); *H01L 2224/8592* (2013.01); *H01L 2924/181* (2013.01); *H05K 1/0306* (2013.01); *H05K 1/053* (2013.01);
(Continued)

(58) Field of Classification Search
USPC ......................................... 361/760, 748, 807
See application file for complete search history.

(56) References Cited

U.S. PATENT DOCUMENTS 6,452,475 B1    9/2002    Kawazu
8,552,463 B2 *  10/2013   Tischler .................. H01L 33/62
                                              257/99

(Continued)

FOREIGN PATENT DOCUMENTS

DE    2837318 A1    3/1980
EP    1985983 A2    10/2008

*Primary Examiner* — Andargie M Aychillhum
(74) *Attorney, Agent, or Firm* — Knobbe Martens Olson & Bear LLP

(57) ABSTRACT

An electrical device includes a first electrical component and a second electrical component connected to each other via an electrical connection having an electrically insulating support plate and a weld joint deposited on the support plate. The weld joint has a melting temperature (Ta) significantly lower than an ambient operating temperature (Ta) to which at least one of the two electrical components and the electrical connection are subjected. The electrical device includes cement that completely covers the exposed weld joint. The material of the cement is chosen to maintain its adhesion and its tightness with respect to the weld joint when the Ta is applied.

12 Claims, 4 Drawing Sheets

(51) Int. Cl.

| | | |
|---|---|---|
| *H05K 1/02* | (2006.01) | |
| *B23K 1/00* | (2006.01) | |
| *H05K 1/18* | (2006.01) | |
| *H05K 3/28* | (2006.01) | |
| *H05K 1/03* | (2006.01) | |
| *H05K 1/05* | (2006.01) | |
| *H05K 3/10* | (2006.01) | |
| *H05K 3/34* | (2006.01) | |

(52) U.S. Cl.
CPC .............. *H05K3/103* (2013.01); *H05K 3/3426* (2013.01); *H05K 2201/1006* (2013.01); *H05K 2201/1028* (2013.01); *H05K 2201/10068* (2013.01); *H05K 2201/10075* (2013.01); *H05K 2201/10083* (2013.01); *H05K 2201/10098* (2013.01); *H05K 2201/10151* (2013.01); *H05K 2201/10287* (2013.01); *H05K 2201/10977* (2013.01); *H05K 2203/049* (2013.01); *Y02P 70/611* (2015.11)

(56) References Cited

U.S. PATENT DOCUMENTS

| | | |
|---|---|---|
| 2003/0098342 A1 | 5/2003 | Ohashi |
| 2010/0123115 A1 | 5/2010 | Farnworth |
| 2014/0268780 A1* | 9/2014 | Wang .................... F21V 19/003 362/249.06 |

* cited by examiner

ELECTRICAL DEVICE AND METHOD FOR PRODUCING SAME

CROSS-REFERENCE TO RELATED APPLICATIONS

This application is the U.S. National Phase under 35. U.S.C. §371 of International Application PCT/EP2013/057042, filed Apr. 3, 2013, which claims priority to French Patent Application No. 1253568, filed Apr. 18, 2012. The disclosures of the above-described applications are hereby incorporated by reference in their entirety.

The present invention relates to the field of electrical devices designed to operate at a high ambient operating temperature.

One preferred application of the electrical device according to the invention relates to the remote measurement of physical properties, for example remote temperature measurement, in environments having a high ambient temperature, in particular using temperature sensors with elastic surface probes. Devices of this type already exist in the state of the art, in which the components are connected to each other by crimping techniques. This type of electrical connection has the drawback of not being able to be used on monocrystalline-type substrates, such as those for example used for temperature sensors with surface probes, when the electrical connection is subjected to high temperatures, for example exceeding 230°, or even exceeding 500° C. Furthermore, this type of connection causes a rigid link between the elements of the device that may induce thermal differential stress effects that are crippling for the integrity of the final device.

The known production of connections using silver paste-type contacts is also unsatisfactory due to excessive electrical losses and a lack of mechanical strength at temperatures above 500° C.

The invention aims to propose an electrical device whereof the components are electrically connected to each other by an electrical connection means, using alternative techniques to those described above, withstanding high temperatures and suitable for the connection of passive components, in particular with elastic surface probes, positioned on monocrystalline-type substrates.

To that end, the invention relates to an electrical device designed to operate at a high ambient operating temperature, comprising:
  a first electrical component;
  a second electrical component; and
  at least one conductive electrical connection, connecting the first and second electrical components, including:
    a first metal element having a first end electrically connected to the first electrical component and a second end;
    a second metal element having a third end electrically connected to the second electrical component and a fourth end; and
    an electrical connection means having an electrically insulating support plate, and connecting the second end of the first metal element and the fourth end of the second metal element by a weld joint deposited on the support plate, the weld joint having a melting temperature significantly lower than the ambient operating temperature of the electrical device;
  at least one of the first and second electrical components and the or each electrical connection being designed to operate at a high ambient operating temperature;
characterized in that the electrical device comprises:
  a cement deposited to cover the entire exposed weld joint, and to cover, while adhering thereto, a first surface zone of the support plate adjacent to a second zone of the support plate in contact with the weld joint, a third surface zone of the first metal element adjacent to a fourth surface zone of the first metal element included in the weld joint, and a fifth surface zone of the second metal element adjacent to a sixth surface zone of the second metal element included in the weld joint, the material of the cement being chosen to maintain its adhesion on the first zone, the third zone and the fifth zone and its tightness with respect to the weld joint when the ambient operating temperature is applied to the electrical device.

According to other features considered alone or in combination:
  the first and second electrical components are positioned on the support plate of the electrical connection means;
  the cement covers, in a single piece and at once, the first electrical component, the second electrical component, the first metal element, the second metal element and the weld joint;
  the first metal element and the second metal element are each a different metal wire or metal ribbon having at least one extension direction not contained in the extension plane of the support plate;
  the first metal element and the second metal element are each a different metal track positioned on the support plate;
  the electrical device comprises an adhesive layer positioned between each of the metal tracks forming the first and second metal elements and the support plate;
  the adhesive layer is made up of a material comprised in the set consisting of titanium, titanium oxide, tantalum, chromium, tungsten, silicon, iridium, iridium oxide, and aluminum doped with copper, titanium or silicon;
  the first and second metal elements are made from a material comprised in the set consisting of platinum, tungsten, iridium, gold, nickel, copper and molybdenum; the support plate is made from a material comprised in the set consisting of alumina, zirconia, aluminum nitride and polycrystalline gallium nitride, and the cement is made from a material comprised in the set consisting of alumina-based ceramic pastes and silver flake-based ceramic pastes;
  the first electrical component is comprised in the set consisting of oscillators, filters, temperature and/or pressure sensors, stress sensors, physicochemical property sensors made from elastic surface wave or elastic volume wave or localized vibration probe piezoelectric transducers; and the second electrical component is comprised in the set consisting of oscillators, filters, temperature and/or pressure sensors, stress sensors, physicochemical property sensors made from surface wave, volume wave or localized vibration probe piezoelectric transducers and wireless antennas;
  the first electrical component is a surface wave temperature sensor, and the second electrical component is a wireless antenna, the wireless antenna being made from a material comprised in the set consisting of chromium, nickel, alloys of chromium and nickel, gold, copper, stainless steel, titanium, platinum, iridium, molybdenum, zinc, tungsten.

The invention also relates to a method for manufacturing an electrical device designed to operate at a high ambient operating temperature, comprising:
  a step for providing a first electrical component, a second electrical component, and an electrically insulating support plate;

a step for providing a first metal element having a first end electrically connected to the first electrical component and a second end, and a second metal element having a third end electrically connected to the second electrical component and a fourth end; and a step for connecting the second end of the first metal element and the fourth end of the second metal element using the weld joint deposited on the support plate, the weld joint having a melting temperature significantly lower than the ambient operating temperature of the electrical device;

characterized in that the method comprises a step consisting of depositing a cement so as to cover the entire exposed weld joint, to cover and adhere to a first surface zone of the support plate adjacent to a second zone of the support plate in contact with the weld joint, a third surface zone of the first metal element adjacent to a fourth surface zone of the first metal element included in the weld joint, and a fifth surface zone of the second metal element adjacent to a sixth surface zone of the second metal element included in the weld joint, the material of the cement being chosen to maintain its adhesion on the first zone, the third zone and the fifth zone and its tightness with respect to the weld joint when the ambient operating temperature is applied to the electrical device.

According to another feature of this aspect of the invention, the step for providing the first and second metal element includes the following steps:

depositing a first adhesive layer and a second adhesive layer on the support plate in the form of a first track and a second track;

depositing the first and second metal elements, respectively, on the first track and the second track, so as to form a first metal track and a second metal track, respectively.

The invention will be better understood upon reading the following description, provided solely as an example and done in reference to the appended drawings, in which.

Figure 1:
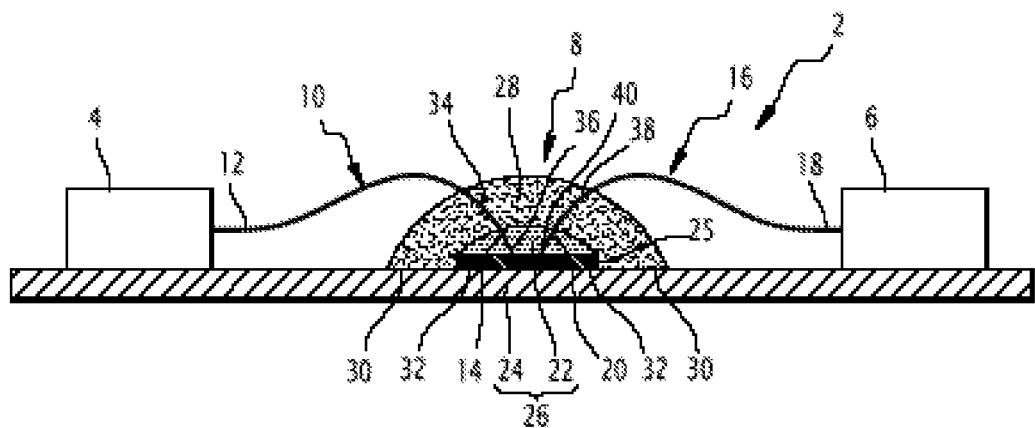
FIG. 1 is a cross-sectional view of a first example embodiment of an electrical device according to the invention.

According to FIG. 1, an electrical device 2, designed to operate at a high ambient operating temperature, denoted Ta, comprises a temperature sensor 4 and a wireless antenna 6.

The temperature sensor 4 is for example a surface acoustic wave (SAW) temperature sensor.

The wireless antenna 6 is for example wirelessly connected to a system for remotely querying the temperature sensor, outside the electrical device 2, subject to a temperature significantly lower than the ambient temperature Ta, and not shown in FIG. 1.

Preferably, the wireless antenna 6 is made up of a material comprised in the set consisting of chromium, nickel, chromium and nickel alloys, gold, copper, stainless steel, titanium, platinum, iridium, molybdenum, zinc and tungsten.

In general, the wireless antenna is made from a material having a melting temperatures significantly lower than the ambient temperature Ta.

The wireless antenna 6 is for example formed by passivated and twisted multi-strand copper wires. This embodiment of the wireless antenna 6 has the advantage of having a remarkable mechanical strength.

According to FIG. 1, the temperature sensor 4 and the wireless antenna 6 are mechanically linked and electrically connected by a conductive electrical connection 8.

The electrical connection 8 comprises a first metal wire 10 having a first end 12 connected to the temperature sensor 4 and having a second end 14, opposite the first end 12.

The electrical connection 8 further comprises a second metal wire 16 having a third end 18, mechanically and electrically connected to the wireless antenna 6, and having a fourth end 20 opposite the third end 18.

The first and second metal wires are, for example, made up of platinum or gold.

Alternatively, the first metal wire 10 and the second metal wire 16 are platinum ribbons.

According to FIG. 1, the second end 14 of the first platinum wire 10 and the fourth end 20 of the second platinum wire 16 are connected by a weld joint 22 deposited on an alumina plate 24 through an adhesive thin layer 25, for example made from a titanium and platinum alloy.

Preferably, the first metal wire 10 and the second metal wire 16 have at least one extension direction not contained in the extension plane of the alumina plate 24.

Thus, the weld joint 22 allows an electrical connection of the temperature sensor 4 and the wireless antenna 6.

Thus, the weld joint 22 and the alumina plate 24 form an electrical connection means 26 for connecting the temperature sensor 4 and the wireless antenna 6.

The weld joint 22 is traditionally made up of a material comprising tin. The melting temperature, denoted Tf, of the material making up the weld joint is traditionally comprised between 190° C. and 250° C.

In all of the present description, a "high ambient operating temperature" is, by definition, an ambient operating temperature Ta of the electrical device 2, situated in an upper part of an ambient operating temperature range of the electrical device 2 and above the melting temperature Tf of the weld joint 22.

It is assumed that the temperature observed on the exposed surface of the weld joint, i.e., the surface that is not in contact with the alumina plate 24, is substantially equal to the ambient operating temperature to within several degrees when the latter prevails in the immediate environment of the electrical device 2.

It should be noted that this definition of a high ambient operating temperature allows several configurations of ambient operating temperature ranges of the electrical device 2, a first configuration in which the melting temperature Tf of the weld joint falls within the range, and a second configuration in which the melting temperature Tf of the weld joint does not fall within the range.

Thus, the high ambient operating temperature of the electrical device 2 is by definition greater than 190° C.

Preferably, the ambient operating temperature of the electrical device 2 is much higher than the melting temperature Tf of the weld joint 22.

The ambient operating temperature of the electrical device 2 is for example greater than 600° C.

Furthermore, the exposed weld joint 22, i.e., the surface of the joint that is not in contact with the alumina plate 24, is completely covered by a cement 28.

The cement 28 is made up of a material chosen to be impermeable to the material of the weld joint 22 when the weld is in the liquid state, and chosen to be adhesive relative to the alumina plate 24 and the first and second metal wires 10 and 16.

The cement 28 is for example an alumina-based ceramic paste, withstanding a temperature higher than the ambient operating temperature of the electrical device 2. That paste has remarkable adherence properties with respect to the platinum.

More specifically, the cement 28 covers and adheres to a first surface zone 30 of the alumina plate 24, peripheral and adjacent to a second surface zone 32 of the alumina plate 24, the second zone 32 corresponding to the surface zone of the alumina plate 24 covered by the weld joint 22.

In this way, the weld joint 22 is tightly confined in the cement 28 and kept mechanically in place on the alumina plate 24 by the cement 28, even when an ambient operating temperature of the electrical device 2, significantly higher than the melting temperature of the weld joint 22, is applied to the device and the weld joint 22 is then in liquid state.

According to FIG. 1, the cement 28 also covers and adheres to a third surface zone 34 of the first metal wire 10 adjacent to a fourth surface zone 36 of the first metal wire 10. The surface zones 34 and 36 are successively situated along the second end 14 of the first metal wire 10, the fourth zone 36 corresponding to the surface zone of the second end 14 of the first metal wire 10 covered by the weld joint 22.

According to FIG. 1, the cement 28 also covers and adheres to a fifth surface zone 38 of the second platinum wire 12 adjacent to a sixth zone 40 of the second platinum wire 12. The surface zones 38 and 40 are successively situated along the fourth end 20 of the second metal wire 16, the sixth zone 40 corresponding to a surface zone of the fourth end 20 of the second metal wire 12 covered by the weld joint 22.

In this way, the cement 28 mechanically maintains the first and second metal wires 10 and 16 and prevents the first and second wires from leaving the weld joint 22 when the ambient operating temperature of the electrical device 2, significantly higher than the melting temperature of the weld joint 22, is applied to the device 2 and the weld joint is then in liquid state.

Thus, the cement 28 makes it possible to provide the electrical connection between the temperature sensor 4 and the wireless antenna 6 when a high ambient operating temperature is applied to the electrical device 2.

In other words, the cement 28 makes it possible to provide the electrical connection between the temperature sensor 4 and the wireless antenna 6 independently of the solid or liquid state of the weld joint 22 and makes it possible to increase the range of operating temperatures of the electrical device toward higher hot temperatures.

Alternatively, the cement 28 covers, in a single piece and at once, the temperature sensor 4, the wireless antenna 6, the first and second metal wires 10 and 16 and the weld joint 22.

Figure 2:
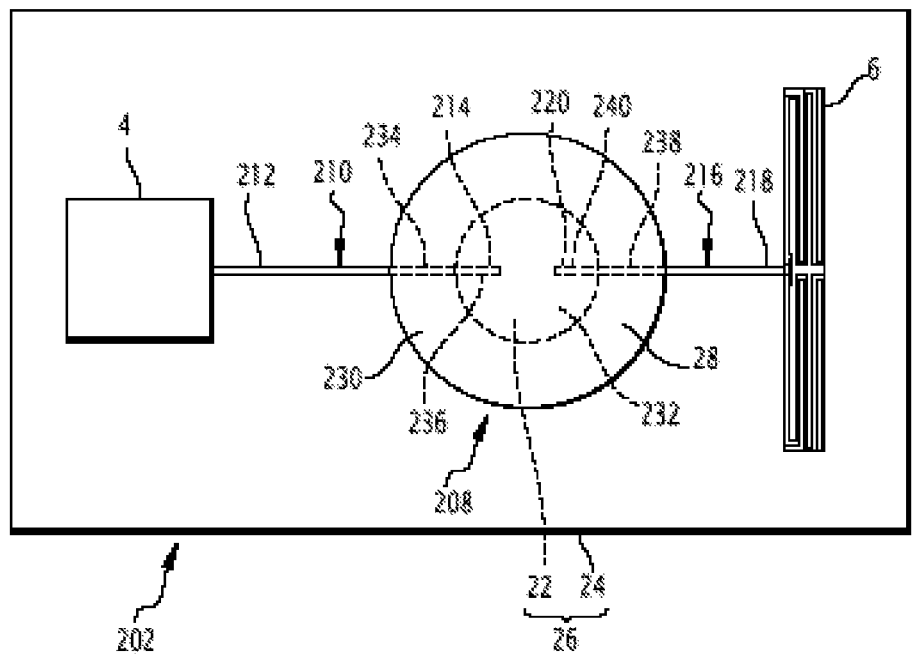
FIG. 2 is a top view of a second example embodiment of an electrical device according to the invention.

According to FIG. 2 and a second example embodiment 202 of an electrical device according to the invention, the electrical device 202 comprises, like the electrical device 2 of FIG. 1, a temperature sensor 4, a wireless antenna 6 and an alumina plate 24, designated using the same references.

The temperature sensor 4 and the wireless antenna 6 are fastened on the alumina plate 24 forming a carrier substrate.

Like the electrical device 2 of FIG. 1, the wireless antenna 6 is, for example, connected by wireless connection to a system for remotely querying the temperature sensor, not shown.

According to FIG. 2, the wireless antenna 6 is a planar antenna. The temperature sensor 4 and the planar antenna 6 are electrically linked and connected by a conductive electrical connection 208.

The electrical connection 208 comprises a first metal track 210 having a first end 212 connected to the temperature sensor 4 and having a second end 214 opposite the first end 212.

The electrical connection 208 further comprises a second metal track 216 having a third end 218 connected to the wireless antenna 6, having a fourth end 220 opposite the third end 218.

The first and second metal tracks 210, 216 are each formed by a metal layer, here copper, deposited and fastened on the alumina plate through an adhesive layer, here made from titanium.

According to FIG. 2, the second end 214 of the first metal track 210 and the fourth end 220 of the second metal track 216 are connected, like the device of FIG. 1, by a weld joint 22 deposited on the alumina plate 24.

Thus, the weld joint 22 and the alumina plate 24 form an electrical connection means 26 for connecting the temperature sensor 4 and the wireless antenna 6.

Furthermore, the weld joint 22 is covered in its entirety by a cement 28 identical to that described in FIG. 1.

More specifically, the cement 28 covers and adheres to a first surface zone 230 of the alumina plate 24, peripheral and adjacent to a second surface zone 232 of the alumina plate 24, the second zone 232 corresponding to the surface zone of the alumina plate 24 covered by the weld joint 22.

In this way, the weld joint 22 is tightly confined in the cement 28 and mechanically kept in place on the alumina plate 24 by the cement 28, even when an ambient operating temperature of the electrical device 202, significantly higher than the melting temperature Tf of the weld joint 22, is applied to the device 202 and the weld joint 22 is then in the liquid state.

According to FIG. 2, the cement 28 also covers and adheres to a third surface zone 234 of the first metal track 210 adjacent to a fourth surface zone 236 of the first metal track 210. The surface zones 234 and 236 are successively situated along the second end 214 of the first metal track 210, the fourth zone 236 corresponding to the surface zone of the second end 214 of the first track 210 covered by the weld joint 22.

According to FIG. 2, the cement 28 also covers and adheres to a fifth surface zone 238 of the second metal track 216 adjacent to a sixth surface zone 240 of the second metal track 216. The zones 238 and 240 are successively situated along the fourth end 220 of the second metal track 216, the sixth zone 240 corresponding to the surface zone of the fourth end 220 covered by the weld joint 22.

Due to good adhesion of the cement 28 on the first and second tracks 210, 216 in their respective third and fifth zones 234 and 238, liquid weld leaks are prevented along the first and second tracks 210 and 216.

In this way, the cement 28 ensures the tightness of the weld joint 22 and the maintenance of the electrical connection 26, even when an ambient operating temperature of the electrical device 202, significantly higher than the melting temperature of the weld joint 22, is applied to the device 202 and the weld joint 22 is then in the liquid state.

Using a first metal track and a second metal track in the electrical device 202 makes it possible to decrease the bulk of the electrical device 202 by incorporating the metal elements made from the tracks in or on the alumina plate, which thus facilitates the implantation of other components.

Using a first metal track and a second metal track incorporated into the alumina plate of the electrical device 202 decreases the risk of breaking or tearing outside the weld joint of the metal elements made by the planar tracks, and/or avoids the use of loop shapes on the metal elements, making it possible to offset expansion/shortening effects of the metal elements.

Alternatively, the cement 28 covers, in a single piece and at once, the temperature sensor 4, the planar antenna 6, the metal tracks 210 and 216 and the weld joint 22. This makes it possible to increase the maintenance of the elements of the electrical device and the electrical connections existing between those elements.

Alternatively, the first and second metal tracks 210 and 216 lack an adhesive layer, the metal of the single layer forming each of the tracks being chosen for its good adherence properties with respect to the alumina plate 24.

Alternatively, the adhesive layer is made up of a material comprised in the set consisting of titanium, titanium oxide, tantalum, chromium, tungsten, silicon, iridium, iridium oxide, and aluminum doped with copper, titanium or silicon.

In general, the adhesive layer has a thickness of several nanometers to several tens of nanometers.

Figure 3:
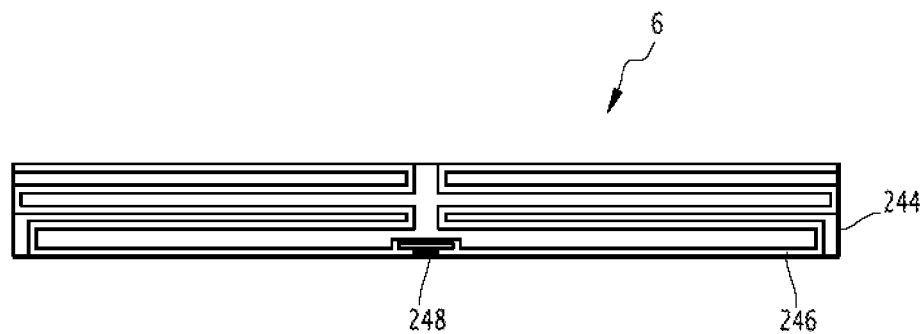
FIG. 3 is a top view of an example antenna that is part of the electrical device described in FIG. 2.

In FIG. 3, the wireless antenna 6 of the electrical devices 2, 202 respectively described in FIGS. 1 and 2 is for example a planar-type antenna.

The planar wireless antenna 6 includes a substrate 244, for example made from a ceramic material, for example alumina, designed to withstand the high ambient operating temperature Ta of the electrical device according to the invention.

A conductive track 246 with bends forming a radiating element is printed on the substrate 244.

The planar antenna 6 further has a connector element 248, allowing the planar antenna 6 to be connected with the temperature sensor 4.

The planar antenna 6 has a width substantially equal to 12 mm, a length substantially equal to 125 mm and a thickness substantially equal to 5 mm, for an operation in the vicinity of the ISM (Industrial-Scientific-Medical) bands centered at 434 MHz.

Thus, the planar antenna 6 has the advantage of having reduced dimensions, in particular in terms of width and thickness, relative to the short-circuited quarter-wave antennas more commonly called PIFA (Planar Inverted-F Antenna).

Figure 4:
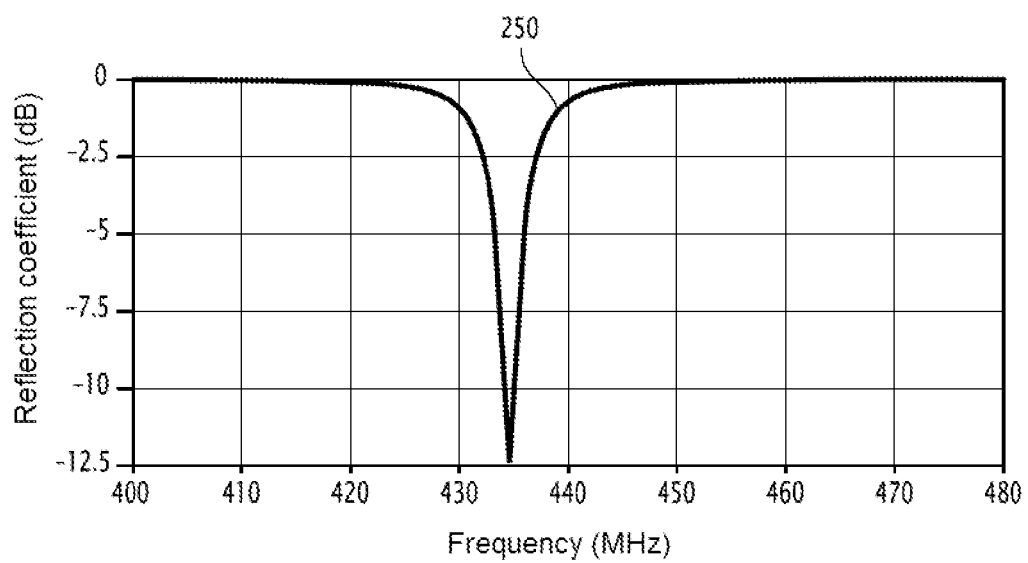
FIG. 4 is the outline of an evolution curve of the reflection coefficient of the antenna described in FIG. 2 as a function of the frequency.

In FIG. 4, a curve 250 shows the evolution of the reflection coefficient of the antenna expressed in dB as a function of the frequency expressed in Mhz when the antenna described in FIG. 3 is adapted to the temperature sensor in its operating domain.

Thus, FIG. 4 shows that the planar antenna described in FIG. 3 is configured to operate in an operating frequency band comprised between 430 MHz and 440 MHz, and operates optimally at frequencies substantially equal to 434 MHz.

The operating frequency band covers a frequency drift range of approximately 7 to 8 MHz around the optimal operating frequency, the drifts being induced by the temperature variations experienced by the temperature sensor, and corresponding to the range of temperatures measured by the sensor.

Figure 5:
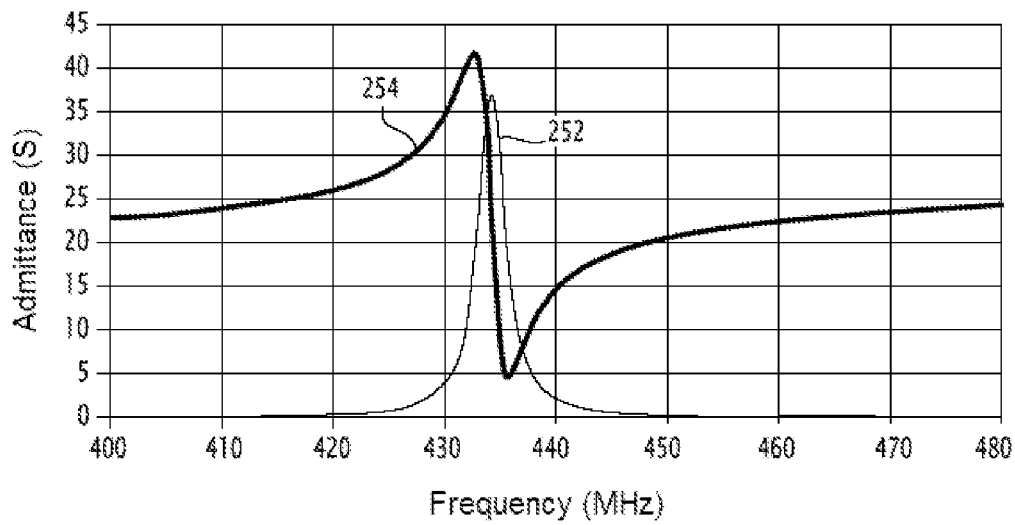
FIG. 5 is a pair of two curves describing the evolution of the real part and the imaginary part of the admittance of the antenna of FIG. 2 as a function of the frequency.

In FIG. 5, the real part of the admittance of the planar antenna described in FIG. 3 is shown by the curve 252, and the imaginary part of the input admittance of the antenna is depicted by curve 254.

Thus, FIG. 5 also shows that the planar antenna as described in FIG. 3 can operate in a frequency band comprised between 430 MHz and 440 MHz.

Figure 6:
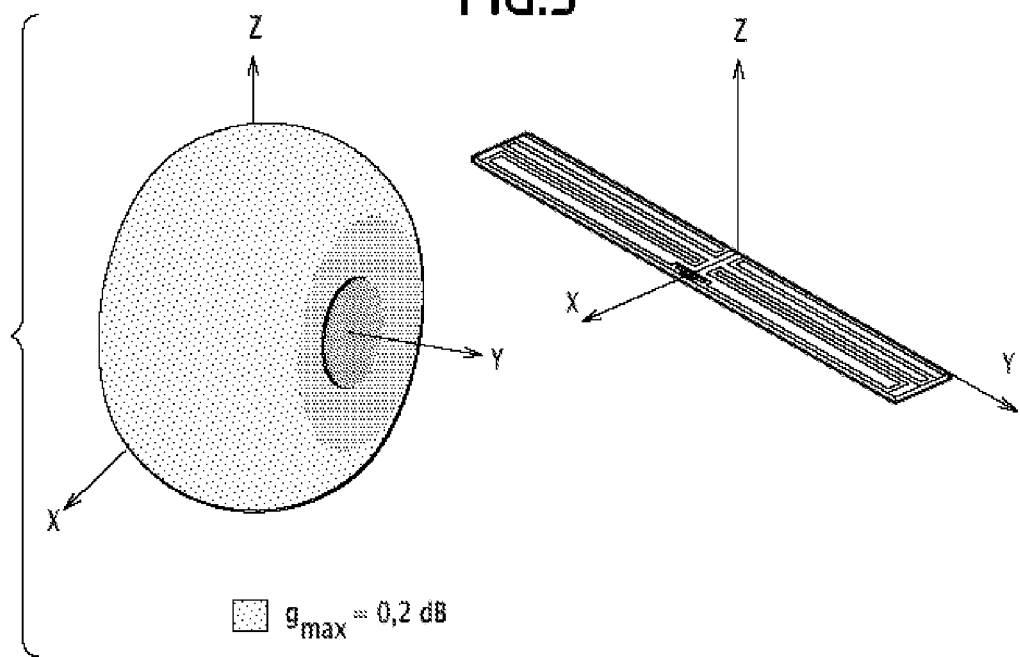
FIG. 6 is a radiation diagram of the antenna described in FIG. 2.

The planar antenna as described in FIG. 3 makes it possible to ensure radiation of the wireless waves shown in the radiation diagram of FIG. 6.

The diagram of FIG. 6 shows that the planar antenna as described in FIG. 3 is designed to achieve a maximum gain $g_{max}$ of 0.2 dB.

In general, the electrical device according to the invention, designed to operate at a high ambient operating temperature, comprises a first electrical component, a second electrical component and at least one electrical conductive link, connecting the first and second electrical components.

In general, the electrical connection includes a first metal element having a first end electrically connected to the first electrical component and a second end, and a second metal element having a third end electrically connected to the second electrical component and a fourth end.

The first and second metal elements are for example metal wires or ribbons as described in the first embodiment of the electrical device 2 described in FIG. 1.

The first and second metal elements are for example metal tracks deposited on an alumina plate as described in the second embodiment of the electrical device 202 described in FIG. 2.

In general, the electrical connection further comprises an electrical connecting means, having an electrically insulating support plate, and connecting the second end of the first metal element and the fourth end of the second metal element by a weld joint deposited on the support plate, the weld joint having a melting temperature significantly lower than the operating temperature of the electrical device.

In general, at least one of the first and second electrical components, and the or each electrical connection, are designed to operate at a high ambient operating temperature.

In general, the electrical device comprises a cement deposited to cover the entire exposed weld joint, and to cover, while adhering thereto, a first surface zone of the support plate adjacent to a second zone of the support plate in contact with the weld joint, a third surface zone of the first metal element adjacent to a fourth surface zone of the first metal element included in the weld joint, and a fifth surface zone of the second metal element adjacent to a sixth surface zone of the second metal element included in the weld joint, the material of the cement being chosen to maintain its adhesion on the first zone, the third zone and the fifth zone and its tightness with respect to the weld joint when the ambient operating temperature is applied to the electrical device.

Preferably, the first and second electrical components are positioned on the support plate of the electrical connection means.

Alternatively, the first and second electrical components are positioned on one or two plates, different from the support plate of the electrical connection means, which allows an implantation of one or two electrical components relative to the electrical connection means.

Alternatively, the cement covers, in a single piece and at once, the first electrical component, the second electrical component, the first metal element, the second metal element and the weld joint.

Preferably, the first and second metal elements are made from a material comprised in the set consisting of platinum, tungsten, iridium, gold, nickel, copper and molybdenum.

In general, the first and second metal elements are made from any metal having a melting temperature lower than the ambient temperature Ta.

Preferably, the support plate is made from a material comprised in the set consisting of alumina, zirconium, aluminum nitride and polycrystalline gallium nitride.

In general, the support plate is made from any nonconductive material having a melting temperature significantly higher than the ambient temperature Ta.

Also preferably, the cement is made from a material comprised in the set consisting of alumina-based ceramic pastes and silver flake-based ceramic pastes.

In general, the cement is made from any ceramic paste which, once annealed and conditioned, has a melting temperature significantly higher than the ambient temperature Ta.

In general, the first electrical component is comprised in the second set consisting of oscillators, filters, temperature and/or pressure sensors, stress sensors, and physicochemical property sensors made from elastic surface wave or elastic volume wave or localized vibration probe piezoelectric transducers.

In general, the second electrical component is comprised in the set consisting of oscillators, filters, temperature and/or pressure sensors, stress sensors, physicochemical property sensors made from piezoelectric transducers with surface waves, volume waves or localized vibrations and wireless antennas.

In particular, the first electrical component is a surface wave temperature sensor, and the second electrical component is a wireless antenna, the wireless antenna being made from a material comprised in the set consisting of chromium, nickel, chromium and nickel alloys, gold, copper, stainless steel, platinum, iridium and molybdenum.

In general, the wireless antenna is made from a material having a melting temperature significantly lower than the ambient temperature Ta.

Figure 7:
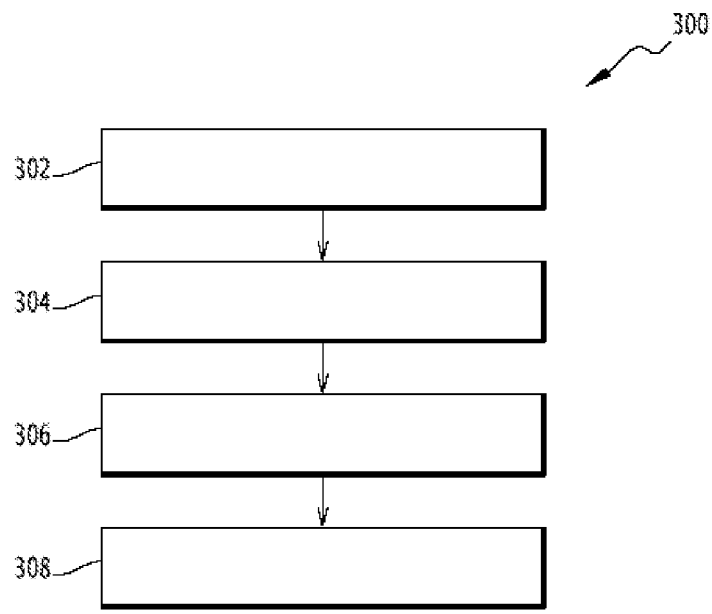
FIG. 7 is a flowchart of a method for manufacturing an electrical device described in FIGS. 1 and 2.

According to FIG. 7, a method 300 for manufacturing an electrical device 2, 202, designed to operate at a high ambient operating temperature described in FIGS. 1 and 2, comprises the following steps, carried out successively.

In a first step 302, a first electrical component 4, a second electrical component 6 and an electrically insulating support plate 24 are provided.

In a second step 304, a first metal element 10, 210 having a first end 12, 212 electrically connected to the first electrical component 4 and a second end 14, 214, and a second metal element 16, 216 having a third end 18, 218 electrically connected to the second electrical component 6 and a fourth end 20, 220 are provided.

In the method for manufacturing the electrical device 202 described in FIG. 2, the step 304 for providing first and second metal elements 210 and 216 includes, in a preferred manner:

- a step for depositing a first adhesive layer and a second adhesive layer on the support plate 24 in the form of a first track and a second track;
- a step for depositing first and second metal elements 210 and 216 on the first track and the second track, respectively, so as to form a first metal track and a second metal track, respectively.

In a third step 306, the second end 14, 214 of the first metal element 10, 210 and the fourth end 20, 220 of the second metal element 16, 216 are connected by a weld joint 22 deposited on the support plate 24, the weld joint 22 having a melting temperature Tf significantly lower than the ambient operating temperature Ta of the electrical device 2, 202.

In a fourth step 308, a cement 28 is deposited so as to cover the entire exposed weld joint 22, to cover and adhere to a first surface zone 30, 230 of the support plate 24 adjacent to a second zone 32, 232 of the support plate 24 in contact with the weld joint 22, a third surface zone 34, 234 of the first metal element 10, 210 adjacent to a fourth surface zone 36, 236 of the first metal element 10, 210 included in the weld joint 22, and a fifth surface zone 38, 238 of the second metal element 16, 216 adjacent to a sixth surface zone 40, 240 of the second metal element 16, 216 included in the weld joint 22, the material of the cement 28 being chosen to maintain its adhesion on the first zone 30, 230, the third zone 34, 234 and the fifth zone 38, 238 and its tightness with respect to the weld joint 22 when the ambient operating temperature Ta is applied to the electrical device 2, 202.

Figure 8:
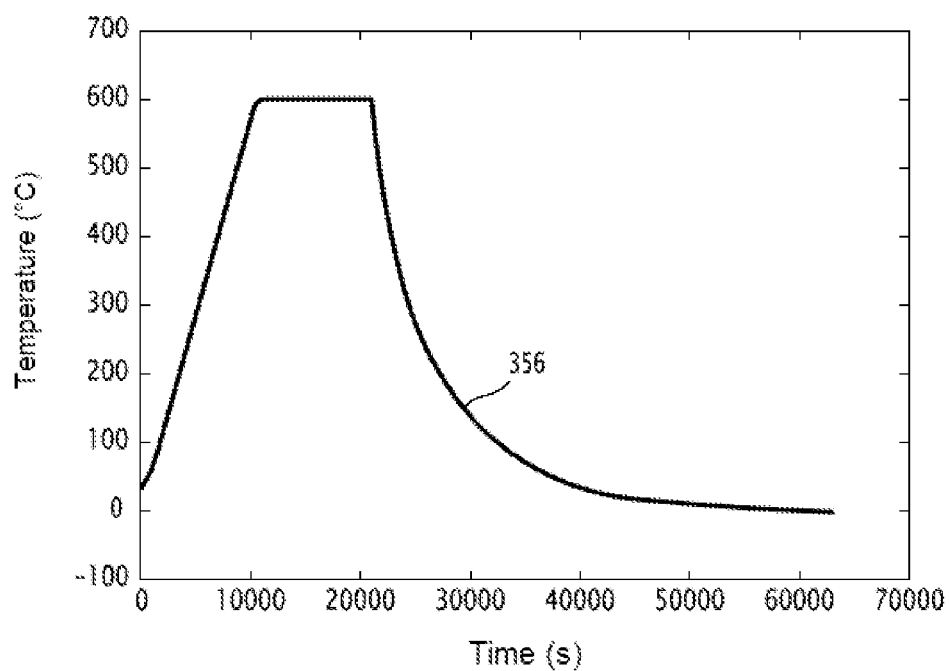
FIG. 8 is an outline of the temperature curve as a function of time measured using an electrical device according to the invention.

According to FIG. 8, a curve 356 shows the evolution over time of a high ambient temperature measurement of an environment, the measurement being done using an electrical device, constituting an alternative of the electrical device 2 according to the invention described in FIG. 1. Here the aim is solely to validate the operation of the at least one electrical connection means according to the invention.

The electrical measuring device making it possible to obtain a curve 356 comprises a temperature probe PT100 forming a first electrical component, and a digital multimeter forming a second electrical component. The probe PT100 and the digital multimeter are electrically connected on a same alumina plate by first and second electrical connections each similar to that described in FIG. 1.

The alumina plate serves as a support for the temperature probe PT100. The probe is relatively close to the first and second electrical connecting means associated with and belonging to the first and second electrical connections, respectively.

The temperature probe PT100 and the second electrical connection means are subjected to a thermal environment with a high temperature while being placed in a drying apparatus, while the digital multimeter, positioned outside the drying apparatus, is subjected to a relatively low temperature, for example approximately 25° C.

The first and second electrical connections each comprise a different metal wire, connected by a first end to a different polarity of the temperature probe PT100, and a different second copper wire, connected to a different terminal of the digital multimeter.

The first and second electrical connection means connect the first and second metal wires respectively, corresponding to the first and second electrical connections, respectively, by a first joint and a second weld joint, the weld joints being separated from each other.

A cement globally and completely covers the two electrical connection means containing the weld joints, the first two metal wires and the temperature probe PT100.

The temperature probe and the electrical connection means, positioned in the drying apparatus, undergo a predetermined temperature cycle. The digital multimeter, placed outside the drying apparatus and connected to the probe through second copper wires, acquires the temperature measurements and sends them to a computer in the form of data. The computer formats the data and then provides the curve 356.

On the curve 356, it is possible to observe the quality of the temperature measurement, the electrical device proving operational for more than 4 hours at temperatures above 500°

C., on the one hand, and the lack of disruption due to the melting of the weld joint 22, on the other hand.

Thus, when a high ambient operating temperature is applied to the electrical connection means, the electrical connection between the first component and the second component is maintained despite the melting of the weld joint. The cement makes it possible to guarantee the mechanical coherence of the first metal element, the second metal element and the weld joint, despite the melting of the weld joint, and thereby makes it possible to maintain the electrical connection between the first electrical component and the second electrical component.

One preferred application of the electrical device according to the invention pertains to the remote measurement of physical properties, for example remote temperature measurement, in environments having a high ambient temperature, using passive temperature sensors, for example with elastic surface or volume waves.

What is claimed is:

1. An electrical device designed to operate at a high ambient operating temperature, comprising:
    a first electrical component;
    a second electrical component; and
    at least one conductive electrical connection, connecting the first and second electrical components, including:
        a first metal element having a first end electrically connected to the first electrical component and a second end;
        a second metal element having a third end electrically connected to the second electrical component and a fourth end; and
        an electrical connection means, having an electrically insulating support plate, and connecting the second end of the first metal element and the fourth end of the second metal element by a weld joint deposited on the support plate, the weld joint having a melting temperature (Tf) significantly lower than the ambient operating temperature (Ta) of the electrical device;
    at least one of the first and second electrical components and the or each electrical connection being designed to operate at a high ambient operating temperature (Ta);
    wherein the electrical device comprises:
        a cement deposited to cover the entire exposed weld joint, and to cover, while adhering thereto, a first surface zone of the support plate adjacent to a second zone of the support plate in contact with the weld joint, a third surface zone of the first metal element adjacent to a fourth surface zone of the first metal element included in the weld joint, and a fifth surface zone of the second metal element adjacent to a sixth surface zone of the second metal element included in the weld joint, the material of the cement being chosen to maintain its adhesion on the first zone, the third zone and the fifth zone and its tightness with respect to the weld joint when the ambient operating temperature is applied to the electrical device.

2. The electrical device according to claim 1, wherein the first and second electrical components are positioned on the support plate of the electrical connection means.

3. The electrical device according to claim 2, wherein the cement covers, in a single piece and at once, the first electrical component, the second electrical component, the first metal element, the second metal element and the weld joint.

4. The electrical device according to claim 1, wherein the first metal element and the second metal element are each a different metal wire or metal ribbon having at least one extension direction not contained in the extension plane of the support plate.

5. The electrical device according to claim 1, wherein the first metal element and the second metal element are each a different metal track positioned on the support plate.

6. The electrical device according to claim 5, comprising an adhesive layer positioned between each of the metal tracks forming the first and second metal elements and the support plate.

7. The electrical device according to claim 6, wherein the adhesive layer is made up of a material comprised in the set consisting of titanium, titanium oxide, tantalum, chromium, tungsten, silicon, iridium, iridium oxide, and aluminum doped with copper, titanium or silicon.

8. The electrical device according to claim 1, wherein the first and second metal elements are made from a material comprised in the set consisting of platinum, tungsten, iridium, gold, nickel, copper and molybdenum; the support plate is made from a material comprised in the set consisting of alumina, zirconia, aluminum nitride and polycrystalline gallium nitride, and the cement is made from a material comprised in the set consisting of alumina-based ceramic pastes and silver flake-based ceramic pastes.

9. The electrical device according to claim 1, wherein the first electrical component is comprised in the set consisting of oscillators, filters, temperature and/or pressure sensors, stress sensors, physicochemical property sensors made from elastic surface wave or elastic volume wave or localized vibration probe piezoelectric transducers; and the second electrical component is comprised in the set consisting of oscillators, filters, temperature and/or pressure sensors, stress sensors, physicochemical property sensors made from surface wave, volume wave or localized vibration probe piezoelectric transducers and wireless antennas.

10. The electrical device according to claim 1, wherein the first electrical component is a surface wave temperature sensor, and the second electrical component is a wireless antenna, the wireless antenna being made from a material comprised in the set consisting of chromium, nickel, alloys of chromium and nickel, gold, copper, stainless steel, titanium, platinum, iridium, molybdenum, zinc, tungsten.

11. A method for manufacturing an electrical device designed to operate at a high ambient operating temperature, comprising:
    a step for providing a first electrical component, a second electrical component, and an electrically insulating support plate;
    a step for providing a first metal element having a first end electrically connected to the first electrical component and a second end, and a second metal element having a third end electrically connected to the second electrical component and a fourth end; and
    a step for connecting the second end of the first metal element and the fourth end of the second metal element using the weld joint deposited on the support plate, the weld joint having a melting temperature (Tf) significantly lower than the ambient operating temperature (Ta) of the electrical device;
    wherein the method comprises a step consisting of depositing a cement so as to cover the entire exposed weld joint, to cover and adhere to a first surface zone of the support plate adjacent to a second zone of the support plate in contact with the weld joint, a third surface zone of the first metal element adjacent to a fourth surface zone of the first metal element included in the weld joint, and a fifth surface zone of the second metal element adjacent to a sixth surface zone of the second metal element included in the weld joint, the material of the cement being chosen to maintain its adhesion on the first zone, the third zone and the fifth zone and its tightness with respect to the weld joint when the ambient operating temperature is applied to the electrical device.

12. The method for manufacturing an electrical device according to claim 11, wherein the step for providing the first and second metal elements includes the following steps:
- depositing a first adhesive layer and a second adhesive layer on the support plate in the form of a first track and a second track;
- depositing the first and second metal elements, respectively, on the first track and the second track, so as to form a first metal track and a second metal track, respectively.

* * * * *